United States Patent [19]

Sun

[11] Patent Number: 5,373,294
[45] Date of Patent: Dec. 13, 1994

[54] CURRENT SWITCH FOR A HIGH SPEED DAC

[75] Inventor: Young-Jen Sun, Fremont, Calif.

[73] Assignee: NEC Electronics, Inc., Mountain View, Calif.

[21] Appl. No.: 90,598

[22] Filed: Jul. 12, 1993

[51] Int. Cl.⁵ .................................. H03M 1/66
[52] U.S. Cl. .................................. 341/136; 341/144
[58] Field of Search ............... 341/136, 144, 150; 307/448, 577

[56] References Cited

U.S. PATENT DOCUMENTS

| | | | |
|---|---|---|---|
| 3,651,517 | 3/1972 | Kurek et al. | 341/144 |
| 4,132,908 | 1/1979 | Hughes | 307/353 |
| 4,831,282 | 5/1989 | Colles | 307/443 |
| 5,075,677 | 12/1991 | Meaney et al. | 341/136 |

OTHER PUBLICATIONS

Article entitled "A 10-b 70-MS/s CMOS D/A Converter" by Nakamura, et al, published in IEEE Journal of Solid-State Circuits, vol. 26, No. 4, dated Apr. 1991, pp. 637-642.

Primary Examiner—Brian K. Young
Attorney, Agent, or Firm—Skjerven, Morrill, MacPherson, Franklin & Friel

[57] ABSTRACT

A current switch for high-speed and high-resolution digital to analog converters (DACs) employs MOSFET devices to control the current switch output in response to binary input signals at logic level voltages. The current switch reduces ringing of the output current that occurs when switching takes place to improve DAC high speed performance by protecting current steering MOSFET transistors against application of the full swing voltage of the binary input signal by applying lower voltage switching signals in place of the full swing logic level voltages. Furthermore, the current switch compensates for parasitic capacitances within the current steering MOSFET transistor that drives the output current.

21 Claims, 3 Drawing Sheets

CURRENT SWITCH FOR A HIGH SPEED DAC

FIELD OF THE INVENTION

This invention relates to converting signals from digital to analog form and, more particularly, to MOSFET current switches for high-speed digital-to-analog conversion of signals.

BACKGROUND OF THE INVENTION

High-speed and high-resolution electronic systems, such as high definition video systems, progressively require faster and more accurate conversion of signals from digital form to analog form. At higher speeds, it becomes more difficult to sustain linearity between the digital input signal and the analog output because of conversion errors introduced by the current switches of the DAC. Various approaches, based on p-channel MOSFET devices, have been suggested to improve the high speed performance of current switches used in DACs. In general, these approaches utilize a current cell that includes a p-channel MOSFET current source and two p-channel MOSFET steering transistors, each of which is capable of conducting the current made available by the current source. One steering transistor has its drain grounded. The other steering transistor, commonly known as the output transistor, has its drain connected to a current summing line of the DAC, the current of which represents the analog value of the digital input signal. A binary signal is applied to each current switch and circuitry is provided so that the binary signal is used to select one of the two transistors in the current cell for conduction of the current. If the output steering transistor is selected, the current from the current switch is combined on the current summing lines with the currents output by other current switches in the accumulation of an analog output proportional to the digital input signal. If the other steering transistor is selected, the current of the current switch is shunted and does not contribute to the total current on the current summing line.

One approach is represented by the current switch described in U.S. Pat. No. 4,831,282, entitled "CMOS INPUT CIRCUIT", issued to Joseph H. Colles on May 16, 1989. In this case, a biasing voltage controlled within precise limits is applied to the gate of the output steering transistor to reduce transient effects due to switching of the steering transistors in each current cell, thereby improving the accuracy of DACs.

A different type of current cell is described in an article by Y. Nakamura et al., entitled "A 10-b 70-MS CMOS D/A Converter", *IEEE Journal of Solid-State Circuits*, V26, N4, pp. 637–642, April 1991. The current cell includes three p-channel MOSFET transistors, one of which is a current source and the other two of which are steering transistors. The steering transistors are driven in phase opposition. Nakamura et al. observe that arrays of such current cells suffer graded and symmetrical errors and propose various measures to reduce the integral linearity error caused by these error distributions across the array.

Despite the development of these techniques, need still remains for a simple yet effective way to improve the high speed performance of DACs. One problem that arises in DACs is ringing of output analog signal.

SUMMARY OF THE INVENTION

The current switch of the present invention offers two improvements to address the problem of output signal ringing. First, the switch provides for the application of a reduced voltage level to the gate terminals of the current switch transistors. Second, the current switch compensates for parasitic capacitances within the current switch transistor that drives the output current.

In accordance with a first aspect of the present invention, a current switch is used to convert a binary logic signal having a particular voltage swing to a current signal. The switch includes three p-channel MOSFET transistors, a gating circuit and a capacitive device. A first of the three transistors has a gate fed by a first bias voltage, a source driven by a source voltage node and a common node drain connection. A second of the three transistors has a gate, a common node connection and a drain. A third transistor has a gate, a common node source connection and a reference voltage drain connection.

The gating circuit provides two binary output signals having a voltage swing less than that of the input binary logic signal. The first of the two output signals drives the gate of the second transistor and the second drives the gate of the third transistor. As the signal applied to the gate of a transistor changes between the logic level voltages, charge coupling effects cause artifactual variations in the output current signal. The gating circuit reduces these artifactual variations by reducing the voltage swing applied to the transistor gates.

The capacitive device has a first connection to the drain of the second transistor and a second connection to the second output of the gating circuit. Thus the output current signal conducts through the second transistor and through the capacitive device with the control signal to the capacitive device being applied in phase opposition to the signal controlling the second transistor. In this manner, the artifactual variation in the output current signal is reduced further.

In accordance with a second aspect of the invention, there is provided a method for switching a substantially constant current in a current switch. The current switch selects between respective conductive paths controlled by a first MOSFET transistor for regulating output current flow and a second MOSFET transistor for regulating shunting of the current to a reference potential. The method includes the step of providing an input voltage representing a binary digital value and generating first and second control signals as a function of the binary input value. These control signals are opposite in polarity and have a maximum voltage less than the input voltage. The first and second control signals are applied to the respective gates of the first and second MOSFET transistors to steer the current to the respective conductive paths. Application of the current steering control signals causes a deviance in the substantially constant current that enlarges for greater steering control signal voltage swings. Thus, the reduced voltage of the first and second control signals limits the deviance in the substantially constant current. Application of a capacitance to the conductive path controlled by the first MOSFET transistor compensates for the deviance in the substantially constant current by driving the applied capacitance in phase opposition to the application of the first control signal.

BRIEF DESCRIPTION OF THE DRAWINGS

Further objects, features and advantages of the invention will become apparent upon consideration of the following detailed description in conjunction with the accompanying drawings, in which.

DETAILED DESCRIPTION

I have found that problems of current overshoot and undershoot in the output of transistor current cells, which are switched by the phase opposite signals, are due to charging or discharging of the parasitic capacitances of the output transistor coupling its gate to its drain. These overshoots and undershoots cause excessive ringing on the current summing line, which limits the high speed performance of the DAC.

Figure 1:
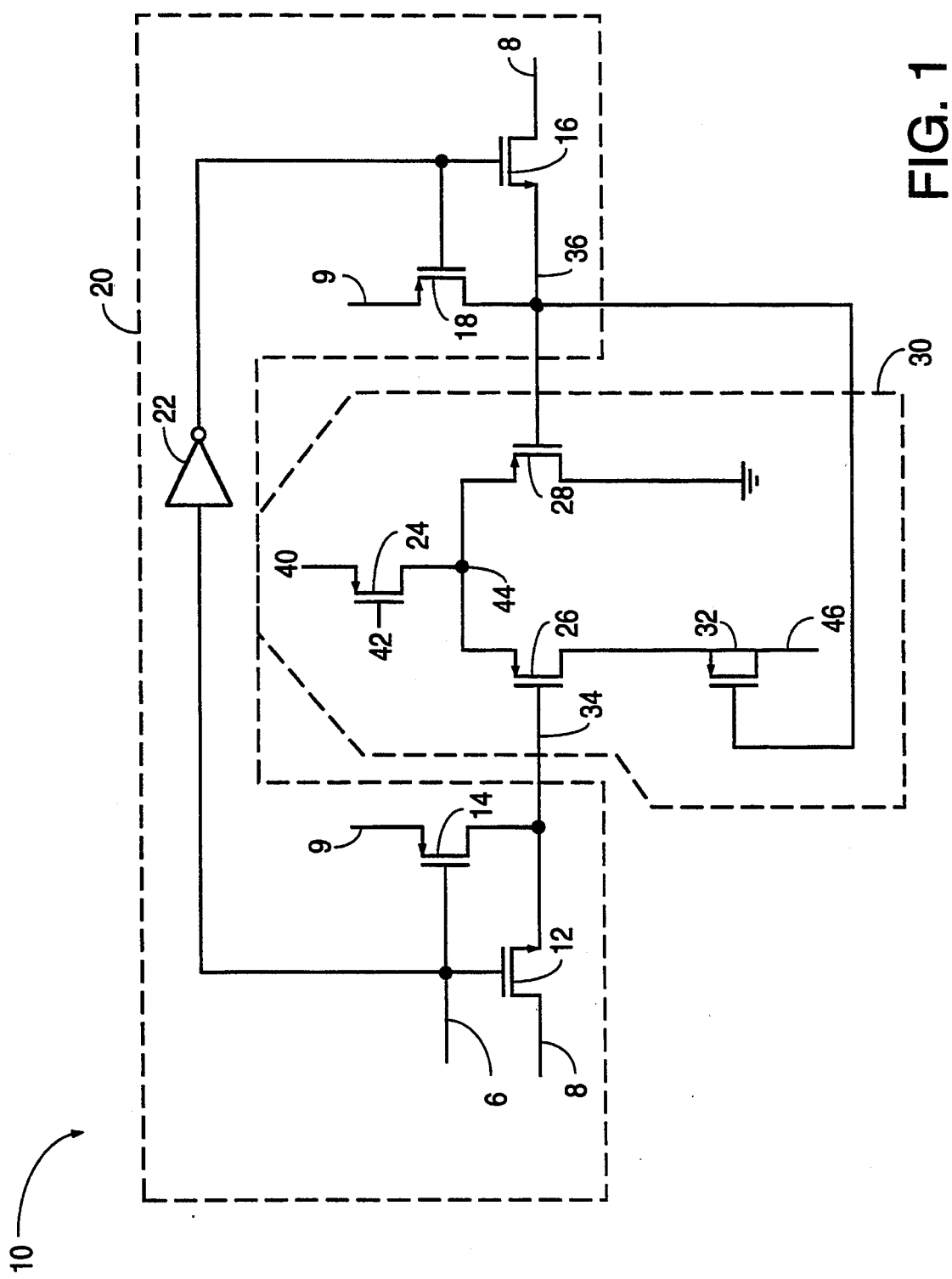
FIG. 1 is a schematic diagram of circuitry within a current switch that is provided to receive binary input voltage signals and to produce output currents that depict an analog representation of the digital signal.

The CMOS current switch 10 of FIG. 1 provides an output current advantageously having reduced overshoots and undershoots. The current switch 10 includes a gate switching circuit 20 and a current cell circuit 30. The current switch 10 is constructed to receive a binary input signal on input signal line 6 in the form of a logic 1 or a logic 0, the values of which relate to digital voltage levels, for example, generally about 5 V and 0 V, respectively. In response to the applied logic input signal on line 6, the current switch generates an output current signal 46 in which the current takes one of two values according to the logic value of the input signal on line 6.

The gate switching circuit 20 includes an input connection to the binary input signal line 6, an inverter 22 and four transmission gate transistors, of which two are p-channel MOS transistors 14 and 18 and two are n-channel MOS transistors 12 and 16. The transmission gate transistors are so-named in reference to their usage in switching the transmission of different voltage supplies to switches within the current cell circuit 30. Two constant voltage lines, 8 and 9, are included in the gate switching circuit 20. The voltages applied to lines 8 and 9 are substantially constant with the potential of the voltage 9 (for example, 3.5 V) having a greater magnitude than the potential of the voltage 8 (0 V). The potential of the voltage 9 is less than the logic 1 voltage level of the binary input signal on line 6 (for example, 5 V).

As is depicted in FIG. 1, the binary input signal line 6 is applied to the gate of the n-channel MOS transistor 12 and to the gate of the p-channel MOS transistor 14. The voltage 8 is applied to the drain terminal of the n-channel MOS transistor 12 and the voltage 9 is applied to the source terminal of the p-channel MOS transistor 14. The source terminal of n-channel MOS transistor 12 and the drain terminal of p-channel MOS transistor 14 are coupled and applied to the gate of a p-channel MOS transistor 26 within the current cell 30 in a manner to be described hereinafter so that the transistor 26 becomes conductive when the binary input signal on line 6 takes a logic level 1 and the transistor 26 becomes non-conductive when the signal takes a logic level 0. The signal applied to the gate of transistor 26 may be termed a gating signal 34, that reflects the same logic value as the binary input signal on line 6. The logic value of the binary input signal on line 6 is inverted by the inverter 22 and then applied to the gate of the n-channel MOS transistor 16 and to the gate of the p-channel MOS transistor 18. The voltage 8 is applied to the drain terminal of the n-channel MOS transistor 16 and the voltage 9 is applied to the source terminal of the p-channel MOS transistor 18. The source terminal of n-channel MOS transistor 16 and the drain terminal of the p-channel MOS transistor 18 are coupled and applied to a p-channel MOS transistor 28 within the current cell 30, as will be related in the later discussion of that circuit. The transistor 28 becomes non-conductive when the binary input signal on line 6 takes a logic level 1 and the transistor 28 becomes conductive when the signal takes a logic level 0. The signal applied to the gate of transistor 28 may be called an inverted gating signal 36, having a complementary relationship to the binary input signal on line 6.

Figure 2:
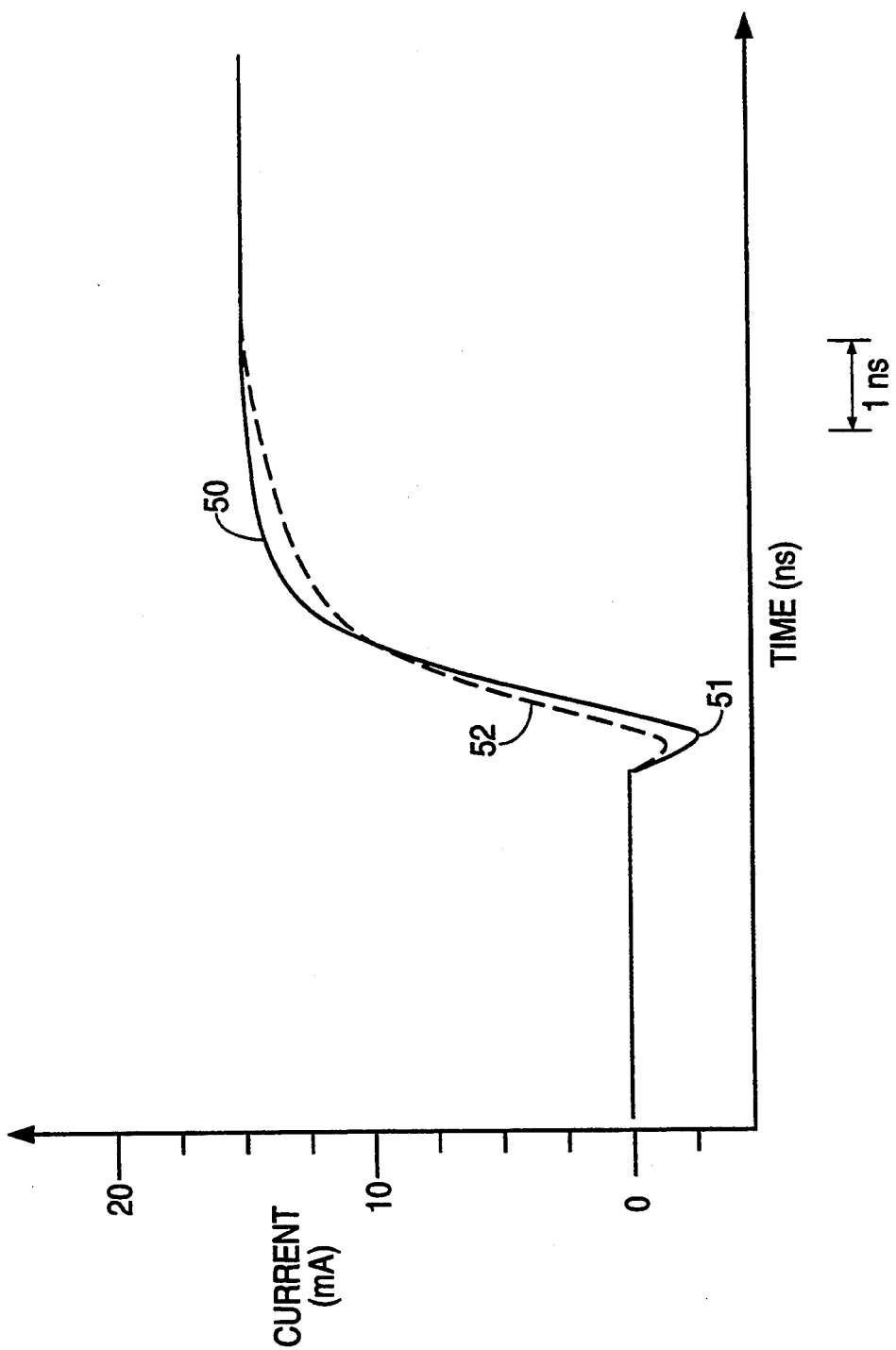
FIG. 2 is a graph depicting the response of the current switch of the present invention to a full-scale input increase.
Figure 3:
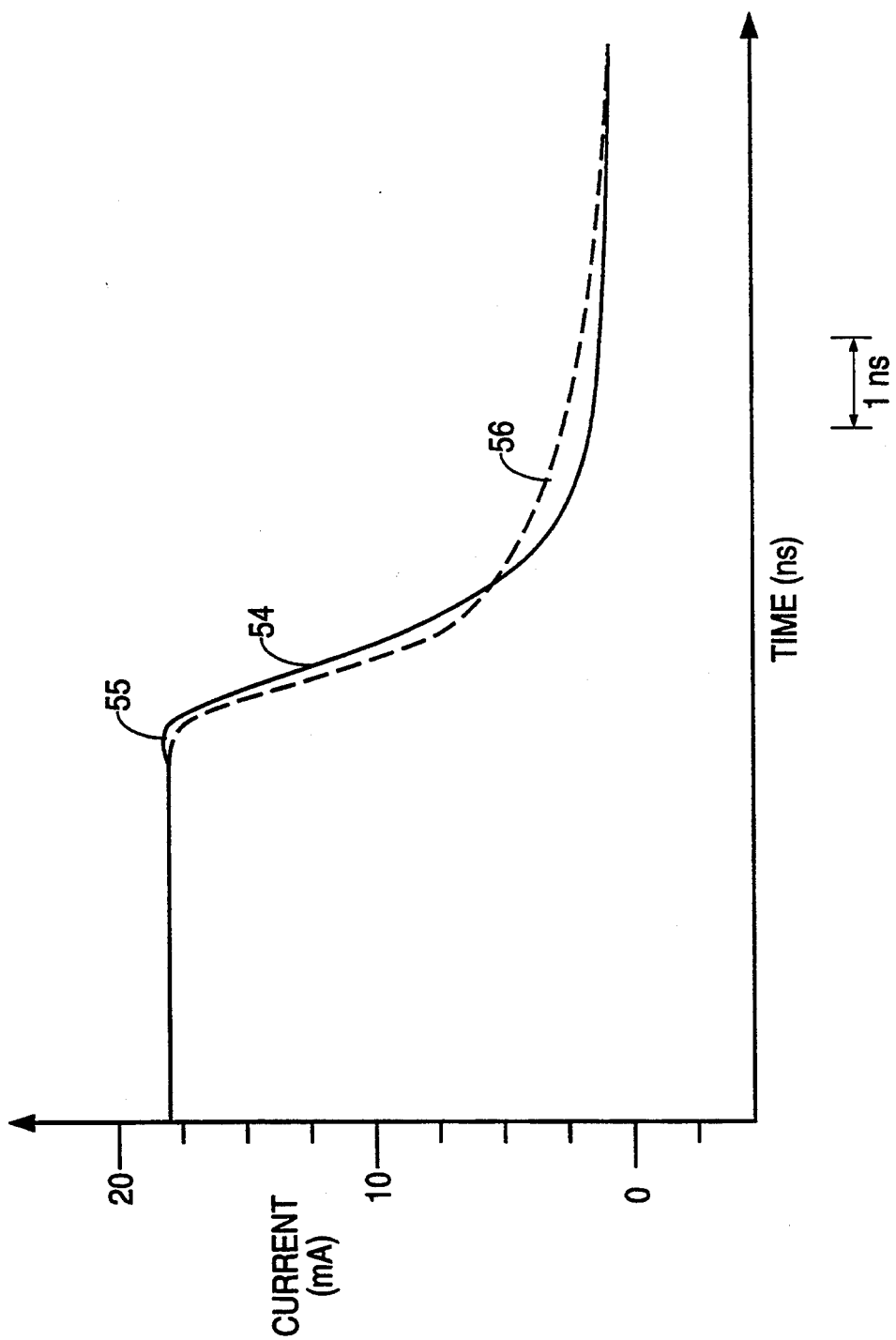
FIG. 3 is a graph depicting the response of the current switch of the present invention to a full-scale input decrease.

Conventional current switch circuits employ transistors in the manner in which transistors 26 and 28 are employed. However, conventional current switch circuits drive the gates of such transistors with logic level signals of 0 V and 5 V. The substantial change in gate voltage from 0 V to 5 V logic level signals in conventional current switch circuits causes the output current to undershoot as the current changes from no conducted current to a constant current. FIG. 2 graphically depicts the undershoot at point 51 of the solid-line electrical signal waveform 50, in which the output current changes in time as the binary input signal is changed. The graph of FIG. 2 is generated by the simulation of a conventional three-transistor (p-channel MOSFET) current cell driven with full-scale phase-opposed gating signals, as it responds to a change from a zero level digital input signal to a full-scale signal. In the same manner, as is shown in FIG. 3, a substantial change in gate voltage from 5 V to 0 V logic level signals in a conventional current switch circuit causes the output current to overshoot as the current changes from a constant current to no current; see point 55 on line 54.

The phenomena of overshoot and undershoot are believed to result from parasitic capacitance of the MOSFET devices in the three-transistor current cell. The parasitic capacitances of concern are a gate-channel capacitance $C_{gc}$ and a gate-drain capacitance $C_{gd}$. As the gate of a p-channel MOSFET is driven high, to a voltage greater than the MOSFET threshold voltage, current begins to flow through the channel of the MOSFET. Unfortunately, the capacitive components $C_{gc}$ and $C_{gd}$ must charge, thereby causing an undershoot. Similarly, as the gate is driven low, current flow begins to decrease. Unfortunately, the capacitive components $C_{gc}$ and $C_{gd}$ must discharge, thereby causing an overshoot.

The amplitude of the deviation in current caused by the overshoot and undershoot phenomena is related to the amplitude of the voltage driving the MOSFET gate, so that lower amplitude driving signals result in output current signals with smaller amplitude overshoots and undershoots. By minimizing the amplitude of these current deviations, the current switch 10 of FIG. 1 performs faster digital to analog signal conversion.

The current switch 10 protects the gates of the p-channel MOS current source transistors 26 and 28 from high logic level signals by interposing the transmission gate transistors 14, 12, 18 and 16 between the logic level binary input signal line 6 and gate terminals of the current source transistor 26 and 28. Although the signals applied to the gate terminals of the transmission gate transistors 14, 12, 18 and 16 vary within a full logic swing (0 V to 5 V), these gates have a high impedance so that the gate terminals of the current source transistors 26 and 28 are protected from the full logic level signals. The voltage levels applied to the gate terminals of transistors 26 and 28 are thus limited to the range between the voltages 8 and 9. Voltages 8 and 9 are selected to provide a reduced voltage change applied to the gates of current source transistors 26 and 28. The improvement in the undershoot and overshoot phenomena of the present invention, as is illustrated by a broken-line electrical signal waveform 52 of FIG. 2 and a broken-line electrical signal waveform 56 of FIG. 3, is partially a result of limiting the voltage applied to the gates of the steering transistors 26 and 28.

The current cell 30 also includes p-channel MOS transistors 24 and 32 and operates as follows. A current-generating potential, such as that provided by the CMOS circuit supply voltage line $V_{DD}$ 40, is applied to the source terminal of the p-channel MOS transistor 24 to source the current supplied by the circuit 30. A constant predetermined current-setting bias voltage 42 is applied to the gate terminal of transistor 24 to set the level of the current flowing through the current cell 30 to a constant value. Various suitable bias voltage generating circuits are well known in the art. The drain terminal of the transistor 24 is connected to the source terminals of the two p-channel MOS transistors 26 and 28, supplying a substantially constant current to node 44. The gate terminal of the transistor 26 is coupled to the gating signal line 34 and the gate terminal of the transistor 28 is connected to the inverted gating signal line 36 so that the logic value of the signal applied to the gate of the transistor 26 is always opposite the logic value of the signal applied to the gate of the transistor 28. The drain terminal of the p-channel MOS transistor 28 is coupled to a reference potential within the CMOS circuit, such as a ground potential. The drain terminal of the p-channel MOS transistor 26 is coupled to both the source and the drain terminals of the p-channel MOS transistor 32, which are shorted to provide a suitable capacitive device. The gate terminal of the transistor 32 is connected to the inverted gating signal line 36 so that the phase of the signal applied to the gate of the transistor 32 is opposite that applied to the gate of transistors 26.

The p-channel MOS transistor 32 is employed to compensate for the parasitic capacitances $C_{gc}$ and $C_{gd}$ of the p-channel MOS transistor 26.

The transistor 32 is added to the circuit as a "dummy" device in series with the output transistor 26. The source and drain terminals of transistor 32 are connected in a short-circuit and the signal applied to the gate of transistor 32 is in opposite phase with respect to the signal applied to the gate of transistor 26. Therefore, the charging and discharging of the parasitic capacitance of transistor 26 is compensated by the discharging and charging of the parasitic capacitance of the transistor 32, so that the undershoots and overshoots are reduced and the switching speed of the current switch 10 is increased.

The current switch 10 thus responds quickly to the logic level applied to the binary input signal line 6.

When a voltage of approximately 5 V (logic 1) is applied to the input 6 of the gate switching circuit 20, 5 volts is applied to the gate of the n-channel MOS transistor 12 and to the gate of the p-channel MOS transistor 14, thereby causing the n-channel MOS transistor 12 to become conductive and the p-channel MOS transistor 14 to become non-conductive which, in turn, drives the p-channel MOS transistor 26 to a conductive state so that the current from the transistor 24 flows through the transistor 26 to the output 46. At the same time, the logic value on binary input 6 is inverted by the inverter 22 and a voltage of approximately 0 V is applied to the gate of the n-channel MOS transistor 16 and to the gate of the p-channel MOS transistor 18, thereby causing the n-channel MOS transistor 16 to become non-conductive and the p-channel MOS transistor 18 to become conductive which, in turn, place the p-channel MOS transistors 28 and 32 in a non-conductive state.

Alternatively, when the binary input signal on line 6 is logic level 0, a voltage of approximately 0 V is applied to the gate of the n-channel MOS transistor 12 and to the gate of the p-channel MOS transistor 14, thereby causing the n-channel MOS transistor 12 to become non-conductive and the p-channel MOS transistor 14 to become conductive which, in turn, set the p-channel MOS transistor 26 in a non-conductive state, resulting in an output current 46 of zero. At the same time, a voltage of approximately 5 V (logic 1) is applied to the gate of the n-channel MOS transistor 16 and to the gate of the p-channel MOS transistor 18, thereby causing the n-channel MOS transistor 16 to become conductive and the p-channel MOS transistor 18 to become non-conductive which, in turn, drives the p-channel MOS transistors 28 and 32 to a conductive state so that the current through the transistor 24 flows from the transistor 28 to the reference potential.

Although the invention has been described with reference to a particular embodiment, it is to be understood that the disclosed embodiment is merely illustrative of the application of the principles of the invention. Numerous modifications may be made therein and other arrangements may be devised without departing from the true scope and spirit of the invention.

What is claimed is:

1. A current switch for converting, in a digital-to-analog converter, a first logic signal having a first voltage swing to a current signal, the current switch comprising:
   a first transistor of a p-channel MOSFET type having a gate connected to a first bias voltage node, a source connected to a source voltage node and a drain connected to a common node;
   a second transistor of a p-channel MOSFET type having a gate, a source connected to the common node and a drain;
   a third transistor of a p-channel MOSFET type having a gate, a source connected to the common node and a drain connected to a reference voltage node;
   a gating circuit for furnishing, at first and second outputs thereof, respective second and third logic signals having a voltage swing less than the voltage swing of the first logic signal, the first output being connected to the gate of the second transistor and the second output being connected to the gate of the third transistor; and
   a capacitive device having a first terminal connected to the drain of the second transistor and a second terminal connected to the second output of the gating circuit.

2. A current switch as in claim 1 wherein the gating circuit comprises:

a second bias voltage node for receiving a second bias voltage, a third bias voltage node for receiving a third bias voltage greater than the second bias voltage and differing therefrom by about the voltage swing of the second and third logic signals;

a first logic signal input for receiving the first logic signal;

an inverter having an input connected to the first logic signal input, the inverter having an output;

a fourth transistor of an n-channel MOSFET type having a drain connected to the second bias voltage node, a source connected to the gate of the second transistor and a gate connected to the first logic signal input;

a fifth transistor of a p-channel MOSFET type having a drain connected to the gate of the second transistor, a source connected to the third bias voltage node and a gate connected to the first logic signal input;

a sixth transistor of an n-channel MOSFET type having a drain connected to the second bias voltage node, a source connected to the gate of the third transistor and a gate connected to the output of the inverter; and a seventh transistor of a p-channel MOSFET type having a drain connected to the gate of the third transistor, a source connected to the third bias voltage node and a gate connected to the output of the inverter.

3. A current switch as in claim 2 wherein the capacitive device comprises an eighth transistor of a p-channel MOSFET type having a source, a drain shorted to the source and a gate connected to the gate of the third transistor, the first terminal of the capacitive device comprising the shorted source and drain of the eighth transistor and the second terminal of the capacitive device comprising the gate of the eighth transistor.

4. A current switch as in claim 1 wherein the capacitive device comprises an fourth transistor of a p-channel MOSFET type having a source, a drain shorted to the source and a gate connected to the gate of the third transistor, the first terminal of the capacitive device comprising the shorted source and drain of the fourth transistor and the second terminal of the capacitive device comprising the gate of the fourth transistor.

5. A current switch for converting, in a digital-to-analog converter, a first logic signal having a first voltage swing to a current signal, the current switch comprising:

a first transistor of a p-channel MOSFET type for generating a substantially constant current, the first transistor having a gate for receiving a first bias voltage, a source for receiving a source voltage and a drain for furnishing the substantially constant current;

a second transistor of a p-channel MOSFET type for steering the substantially constant current, the second transistor having a gate for receiving a first control signal, a source for receiving the substantially constant current from the drain of the first transistor and a drain for receiving a reference voltage;

a third transistor of a p-channel MOSFET type for steering the substantially constant current, the third transistor having a gate for receiving a second control signal, a source for receiving the substantially constant current from the drain of the first transistor and a drain for furnishing an output current;

a gating circuit for generating the first and second control signals as logic signals based on an input logic signal having a particular voltage swing, the input logic signal representing two logic states and the second and third transistors being responsive to the first and second control signals for steering the substantially constant current through one of the second and third transistors depending on the logic state represented by the input logic signal, the current steering inherently causing a deviance in the substantially constant current proportional to the voltage swing of the steering control signal, and the first and second control signals having a voltage swing less than the voltage swing of the input logic signal to limit the deviance in the substantially constant current; and a capacitive device having a first terminal for receiving the output current and a second terminal for receiving the first control signal, the first control signal being in phase opposition to the deviance in the output current so as to at least partially cancel the deviance.

6. A method for switching a substantially constant current in a current switch of a digital-to-analog converter, the current switch for selecting between respective conductive paths controlled by a first MOSFET transistor to regulate output current flow and a second MOSFET transistor to regulate current shunted to a reference potential, the method comprising the steps of:

providing an input voltage representing a binary digital value;

generating first and second control signals as a function of the binary input value, the respective signals being opposite in logic value and having a maximum voltage less than the input voltage;

applying the first and second control signals to respective gates of the first and second MOSFET transistors to steer the substantially constant current to the respective conductive paths, the current steering inherently causing a deviance in the substantially constant current proportional to the voltage swing of the steering control signal so that the reduced voltage of the first and second control signals limits the deviance in the substantially constant current;

applying a capacitance to the conductive path controlled by the first MOSFET transistor;

compensating for the deviance in the substantially constant current by driving the applied capacitance in phase opposition to the application of the first control signal.

7. A current switch comprising:

means for receiving a binary input signal, the binary input signal having a first voltage level representing a first logic characteristic and having a second voltage level representing a second logic characteristic;

means for generating a first transistor control signal and a second transistor control signal, the first transistor control signal for activating a transistor when the binary input signal has the first voltage level and for deactivating a transistor when the binary input signal has the second voltage level and the second transistor control signal for deactivating a transistor when the binary input signal has first voltage level and for activating a transistor when the binary input signal has the second voltage level, the generating means including means for limiting the voltage of the first and second transistor control signals within predetermined voltage ranges;

a current source circuit including means for generating a current, a first transistor controllably activated and deactivated by the generating means first control signal to conduct the generated current when the binary input signal has the first voltage level and to block the generated current when the binary input signal has the second voltage level, and a second transistor controllably activated and deactivated by the generating means second control signal to block the generated current when the binary input signal has the first voltage level and to conduct the generated current when the binary input signal has the second voltage level; and a third transistor connected in series with the current source circuit first transistor and having a short-circuit coupling of its conduction path, the third transistor being controllably activated and deactivated by the generating means second control signal.

8. A current switch in accordance with claim 7, wherein the control signal generating means further comprises:

a like-logic value output node for providing an output signal having the same logic value as the binary input signal;

an inverted-logic value output node for providing an output signal having the opposite logic value of the binary input signal;

means for supplying a first bias voltage;

means for supplying a second bias voltage that is different from the first bias voltage;

a first n-channel MOS transistor having a drain terminal coupled to the first bias voltage supplying means, a gate terminal coupled to the binary input signal receiving means and a source terminal;

a first p-channel MOS transistor having a source terminal coupled to the second bias voltage supplying means, a gate terminal coupled to the binary input signal receiving means and a drain terminal coupled to the source terminal of the first n-channel MOS transistor;

an inverter having an input coupled to the binary input signal receiving means and an output for supplying an inverted-logic value signal;

a second n-channel MOS transistor having a drain terminal coupled to the first bias voltage supplying means, a gate terminal coupled to the output of the inverter, and a drain terminal;

a second p-channel MOS transistor having a source terminal coupled to the second bias voltage supplying means, a gate terminal coupled to the output of the inverter, and a drain terminal coupled to the source terminal of the second n-channel MOS transistor.

9. A current switch in accordance with claim 8, wherein the current source circuit current generating means further comprises means for providing a supply voltage, means for supplying a current-setting bias voltage and a p-channel MOS transistor having a source terminal coupled to the supply voltage, a gate terminal coupled to the current-setting bias voltage and a drain terminal.

10. A current switch in accordance with claim 9, wherein the current source circuit first transistor is a p-channel MOS transistor having a source terminal coupled to the drain terminal of the p-channel MOS transistor of the current source circuit current generating means, a gate terminal coupled to the control signal generating means like-logic value output node and a drain terminal.

11. A current switch in accordance with claim 10, wherein the current source circuit second transistor is a p-channel MOS transistor having a source terminal coupled to the drain terminal of the p-channel MOS transistor of the current source circuit current generating means, a gate terminal coupled to the control signal generating means inverted-logic value output node and a drain terminal.

12. A current switch in accordance with claim 11, wherein the third transistor is a p-channel MOS transistor having a source terminal interconnected to its drain terminal and coupled to the drain terminal of the first transistor of the current source circuit current generating means and a gate terminal coupled to the control signal generating means inverted-logic value output node.

13. A current switch in accordance with claim 12, wherein the generating means limiting means includes means for constraining the voltage of the first and second transistor control signals to be less than a selected maximum voltage.

14. A current switch in accordance with claim 13, wherein the generating means limiting means includes means for constraining the voltage of the first and second transistor control signals to change less than a selected maximum voltage change when the binary input signal changes.

15. A current switch in accordance with claim 7, wherein the generating means limiting means includes means for constraining the voltage of the first and second transistor control signals to be less than a selected maximum voltage.

16. A current switch in accordance with claim 7, wherein the generating means limiting means includes means for constraining the voltage of the first and second transistor control signals to change less than a selected maximum voltage change when the binary input signal changes.

17. A current switch comprising:

a gate switching circuit including an input node for receiving a binary input signal;

a like-logic value output node for providing an output signal having the same logic value as the binary input signal;

an inverted-logic value output node for providing an output signal having the opposite logic value of the binary input signal;

means for supplying a first bias voltage;

means for supplying a second bias voltage that is different from the first bias voltage;

a first n-channel MOS transistor having a drain terminal coupled to the first bias voltage supplying means, a gate terminal coupled to the input node and a drain terminal, a first p-channel MOS transistor having a source terminal coupled to the second bias voltage supplying means, a gate terminal coupled to the input node and a drain terminal coupled to the source terminal of the first n-channel MOS transistor;

an inverter having an input coupled to the input node and having an output;

a second n-channel MOS transistor having a drain terminal coupled to the first bias voltage supplying means, a gate terminal coupled to the output of the inverter and a drain terminal;

a second p-channel MOS transistor having a source terminal coupled to the second bias voltage supplying means, a gate terminal coupled to the output of the inverter and a drain terminal coupled to the source terminal of the second n-channel MOS transistor; and a current source circuit including
   means for supplying an energizing voltage;
   means for supplying a reference potential;
   a first p-channel MOS current source transistor having a source terminal coupled to the energizing potential supplying means, a drain terminal coupled to the source terminal of the third p-channel current source transistor and a gate terminal coupled to the like-logic node;
   a second p-channel MOS current source transistor having a source terminal coupled to the energizing potential supplying means, a drain terminal coupled to the reference potential supplying means and a gate terminal coupled to the inverted-logic node; and
   a third p-channel MOS current source transistor having a gate terminal coupled to the inverted-logic node and mutually interconnected source and drain terminals, the mutually interconnected terminals being coupled to the drain terminal of the first p-channel current source transistor.

18. A current switch in accordance with claim 17, wherein the second bias voltage is greater than the first bias voltage.

19. A current switch in accordance with claim 18, wherein the first bias voltage is substantially constant and the second bias voltage is substantially constant.

20. A current switch in accordance with claim 19, wherein binary input signal has a voltage in the range from approximately 4 to 5 volts for signals having a first logic value and has a voltage in the range from approximately −0.5 to 0.5 volts for signals having an inverted logic value, the second bias voltage is in the range from approximately 3 to 4 volts and the first bias voltage is in the range from approximately −0.5 to 0.5 volts.

21. A current switch in accordance with claim 20, wherein the current source circuit energizing voltage supplying means further comprises means for providing a supply voltage, means for supplying a current-setting bias voltage and a fourth p-channel MOS current source transistor having a source terminal coupled to the supply voltage, a gate terminal coupled to the current-setting bias voltage and a drain terminal coupled both to the source terminal of the first p-channel MOS current source transistor and to the source terminal of the second p-channel MOS current source transistor.

* * * * *